United States Patent [19]

Joslin

[11] Patent Number: 5,669,512

[45] Date of Patent: Sep. 23, 1997

[54] INJECT-EJECT SYSTEM FOR RACK MOUNTED PLUG-IN MODULES

[75] Inventor: Arnold L. Joslin, Loveland, Colo.

[73] Assignee: Hewlett-Packard Co., Palo Alto, Calif.

[21] Appl. No.: 369,070

[22] Filed: Jan. 5, 1995

[51] Int. Cl.$^6$ ............................................. A47F 5/00
[52] U.S. Cl. ........................................ 211/41; 361/798
[58] Field of Search ................................ 361/798, 801; 211/41

[56] References Cited

U.S. PATENT DOCUMENTS

| | | | |
|---|---|---|---|
| 3,451,034 | 6/1969 | Beale | 211/41 X |
| 4,603,375 | 7/1986 | Miller et al. | 361/399 |
| 4,996,631 | 2/1991 | Freehauf | 361/415 |
| 5,162,979 | 11/1992 | Anzelone et al. | 361/798 X |
| 5,309,325 | 5/1994 | Dreher et al. | 361/798 X |
| 5,432,682 | 7/1995 | Giehl et al. | 361/801 X |
| 5,504,656 | 4/1996 | Joist | 211/41 X |

FOREIGN PATENT DOCUMENTS

| | | | |
|---|---|---|---|
| 64-13798 | 1/1989 | Japan | 361/798 |
| 4-101499 | 4/1992 | Japan | 361/798 |

OTHER PUBLICATIONS

"Versatile Logic Cage for Accepting and Positively Retaining a Multitude of Logic Cards," IBM Technical Disclosure Bulletin, vol. 32, No. 10B Mar. 1990.

*Primary Examiner*—Robert W. Gibson, Jr.
*Attorney, Agent, or Firm*—Cynthia S. Baan

[57] ABSTRACT

An injector/ejector system that provides for easy insertion and removal of a printed circuit board module into and out of a mainframe. The injector/ejector system is defined by a unitary lever arm and two curved finger extensions oppositely situated and which is attached to a front panel of a circuit board module proximate to an exterior corner of the circuit board module. The lever is attached with a shoulder screw assembly to the module and operates through a cutout notch in the front panel that extends approximately 4.0 mm from the edge of the front panel. The grasping end of the lever arm is formed in such a manner that when the module is in the installed position, the grasping surface of the lever is approximately 3.7 mm away from the surface of the front panel, thus allowing the operator to insert his/her fingertip between the front panel of the module and the lever, thus permitting actuation of the ejection process by the operator's fingertip. The lever is preferably made of steel to reduce the probability of galling of injection/ejection bearing surfaces on both the lever and the mainframe.

4 Claims, 13 Drawing Sheets

INJECT-EJECT SYSTEM FOR RACK MOUNTED PLUG-IN MODULES

FIELD OF THE INVENTION

The present invention relates generally to the field of circuit board inject/eject systems and more particularly to systems including a printed circuit board plug-in unit having an integral front panel, such as VXI modules. In particular, this invention provides an improved inject/eject lever system for the insertion and ejection of printed circuit boards to a circuit board rack, such as a VXI mainframe.

BACKGROUND OF THE INVENTION

In the electronics industry, printed circuit boards are often interconnected in card cages or mainframes that include mounting hardware and electrical connections for receiving the printed circuit boards. A typical system is a VXI mainframe and corresponding printed circuit (PC) board modules, which have been standardized by the VXI Consortium recommendations for interchangeability between different vendors. Generally, the printed circuit boards are housed in modules which are slidably received by the mainframes with the electrical connection being made by electrical plug-in connectors at the back of the printed circuit boards and corresponding electrical connections in the mainframe.

The gripping action provided by the two interconnected electrical connectors: namely, the connector or connectors carried by the printed circuit board and the connector or connectors associated with the card cage or mainframe, make it difficult to insert and remove the printed circuit board plug-in module from the electrical connectors of the card cage. Typically, two handles are mounted on the front panel of the plug-in module to permit the plug-in module to be manually pushed-in and pulled-out of the mainframe connectors. This brute force method of injection/ejection can damage the mainframe, the module or the electrical connectors. It is also a difficult process if the mainframe is not against a supporting wall or is on wheels. Moreover, as the number of inputs and outputs per PC board increases, the force required to insert and remove the modules from the mainframe increases. Currently, plug-in modules can have between 96 and 320 electrical connection pins which correspond to an injection/ejection force of approximately 24 to 75 pounds.

Accordingly, ejectors have been mounted on the front panel of some types of plug-in modules as an aid in extracting the printed circuit board plug-in modules from the electrical connectors of the mainframes. In VXI mainframes, a common extruded aluminum surface is conventionally provided on the mainframe adjacent to the front panel of the plug-in module to function as a fixed ejection surface for any ejector mounted to the front panel of the module.

A typical prior art ejector facilitates the removal of the module by using a pivoting lever arm to bear against the fixed ejection surface and reduce the force necessary to be applied by the user. Existing ejectors typically consist of several components which must be assembled and attached to the mainframe or, in some cases, to the printed circuit board. There are typically two ejectors on each printed circuit board module, one adjacent to each end of the front panel, to permit ejection of the module without skewing or twisting the PC board. One such ejector is disclosed in U.S. Pat. No. 4,603,375 to Miller et al, which patent is hereby incorporated herein by reference for all that it discloses.

Some ejector systems have been developed in which the ejector lever is also capable of injector operation. One type of system for accomplishing both injection and ejection involves use of a member which is pivotally mounted on the circuit board, and which includes a single finger that extends into a receiver such as a notch in the adjacent frame of the mainframe. This type of configuration typically creates excessive fatigue problems on that single finger, since that single component is stressed in one direction upon insertion, and in the other direction upon ejection.

Another configuration for accomplishing both injection and ejection using the same pivotal device comprises a device which is pivotally mounted on a circuit board, and which has a receiver or notch located adjacent the mainframe chassis. The mainframe chassis includes a single member such as a panel edge that fits within the receiver or notch to provide the bearing surfaces. Again, fatigue problems are increased in this type of configuration, since a single member provides the bearing surfaces used for both insertion and ejection. Furthermore, operation of the injection/ejection systems described above involves an inherent problem of inserting the single finger within the receiver in the first mentioned embodiment, or inserting the notch around the single bearing surface in the second mentioned embodiment, during insertion of the plug-in module. This requires proper alignment of the insertion/ejection handle or use of additional components to accomplish the alignment during the insertion process.

In addition to these problems, the above-described injection/ejection systems could not be used in conjunction with present VXI printed circuit board plug-in module technology (a new industry standard for the configuration of mainframes), since the present VXI standard specifications dictate use of an insertion bearing surface that is provided by an insertion member positioned on the mainframe chassis at a location which is separate and removed from the ejection bearing surface.

A more recent approach to the problem of injection and ejection of printed circuit boards into mainframes is shown in FIGS. 1 and 2, which illustrate a pair of injector/ejectors 10A and 10B as components of a system including printed circuit board plug-in module 12 having a front panel 14 secured to one end of the plug-in module 12 in an orthogonal relationship. Two longitudinally-slotted openings 11A and 11B in the front panel 14 permit the pivotal movement of injector/ejectors 10A and 10B. Module 12 has an electrical connector 16 having shrouded male pins 18 extending outwardly therefrom, two such electrical connectors 16 are illustrated in FIG. 1 that are arranged adjacent opposite corners of module 12 and adjacent the inner edge thereof. A mainframe is generally defined by a pair of spaced module guides 20 (partially illustrated) of conventional construction. Guides 20 are provided with a longitudinal slot to slidably receive and guide opposite edges of module 12 in its travel toward the rear of the mainframe chassis. The mainframe includes electrical connectors 22 that are mounted in a spaced relationship with guides 20 and fixed in position between the ends of the guides so as to receive the male pins 18 of connectors 16 in electrical circuit relationship. Connectors 22 are suitably supported by the mainframe (not shown) in a fixed position and have female receptacles for receiving the pins 18.

The configuration of the mainframe chassis includes a common surface 24 that functions as an ejection bearing surface for extracting the electrical connectors 16 from the electrical connectors 22. The ejection bearing surface 24 is arranged behind the front panel 14 of the module when the four electrical connectors 16 and 22 are interconnected. Ejection bearing surface 24 is behind front panel 14 at the top and bottom thereof, providing an ejection bearing surface for both injector/ejectors 10A and 10B. Likewise, an injection bearing surface 26 is also provided on an inner surface of the mainframe chassis, adjacent to the forward end of plug-in module 12, at both top and bottom.

Injector/ejectors 10A and 10B function in response to a pivoting force applied thereto, which force is transmitted to the ejection bearing surface 24 to cause the plug-in module 12 to be moved outwardly from the electrical connectors 22 in response thereto. Specifically, with reference to FIG. 2, when a downward pivotal force is applied to lever 30, ejection surface 34 of ejection finger 32 contacts ejection bearing surface 24, transmitting the pivotal force and causing connectors 16 of plug-in module 12 to be disengaged from connectors 22.

Also extending from the base of lever handle 30 in a downwardly direction spaced from ejection finger 32 is an injection finger 36. The lower forward portion of injection finger 36 defines a ridge that extends generally in the direction of the ejection surface 34, and forms an injection surface 38. The injection bearing surface 38 contacts injection bearing surface 26, and communicates forces from the lever handle 30 through the injection finger 36 and injection surface 38 to the injection bearing surface 26 during injection of the plug-in module 12 into the mainframe chassis.

The injector/ejector system just described is disclosed in U.S. Pat. No. 4,996,631 entitled Injector/Ejector System for Rack Mounted Plug-in Modules with Front Panels by Freehauf, which patent is hereby incorporated by reference for all that it teaches. Freehauf teaches an aluminum lever that is made by a machining or metal extrusion process. Since the current VXI standard calls for injection and ejection bearing surfaces along the front of the mainframe to be aluminum, Freehauf's aluminum levers are prone to cause galling of the injection and ejection bearing surfaces of the mainframe or the lever.

Freehauf's system further teaches two elongated apertures in the front panel 14 of the plug-in module to accommodate the two injector/ejector levers 10A and 10B. The apertures and the levers extend approximately 7.7–8.0 mm from the panel edge, thus limiting the useful area of the front panel to approximately 22.3–22.0 mm. This can be problematic as today's plug-in module front panels are often crowded with electrical components, including connector pins that are also placed on the front of the P.C. board plug-in modules to accommodate the connection of terminal cards, inputs and outputs, or other electrical interconnections beyond those provided at the back of the mainframe. Thus, the space on the front panel is necessary for electrical connectors which now contain upwards of 300 pins.

Freehauf's injection/ejection system also requires 6 additional components beyond the front panel and the circuit board to be manufactured and assembled. This is a costly solution both in the cost of the components and the cost of assembly/disassembly.

Still further, in the module's installed position, the back surface 80 of Freehauf's lever 30 is flush with the front panel 14, which requires the wedging of the user's fingernail, a screwdriver blade or other flat object under lever 30 in order to start the ejection process. As 24–75 pounds of force is required to eject the module and Freehauf's system permits only a minimal amount of rotation before surface 34 of lever 30 engages surface 24 of the mainframe at the commencement of the ejection procedure, this procedure has resulted in many damaged fingers, fingernails, and front panels due to users trying to pry the lever 30 up from the front panel.

It would, therefore, be a substantial improvement in the technology to provide an injector/ejector system adapted for use with VXI (and other) printed circuit board plug-in module technologies, and which avoids the difficulties of existing systems such as excess force on the P.C. board, mainframe, module, or electrical connectors; excess stress on and twisting of the P.C. board; excess fatigue and galling of lever fingers or extruded injection/ejection force bearing surfaces of the mainframe; excess number of inject/eject components; excess usage of front panel space for the inject/eject system; or excess damage to user's fingers or the front panel due to the user having to pry the inject/eject lever from the surface of the front panel at the beginning of the ejection process.

SUMMARY OF THE INVENTION

The present invention comprises an improved injector/ejector system in which the number of components are reduced over the systems of the prior art and the injecting and ejecting operations are effectuated by components separately spaced from the lever and made of such material and in such a manner to thereby increase the durability of the system and reduce the stress, wear, and galling that occurs to the stress bearing surfaces of the prior art solutions. The present invention also increases the useable panel space and improves the ease of use over the injection/ejection system of the prior art. The injector/ejector system of the present invention may be utilized in any currently specified VXI printed circuit board plug-in module system and other electronic plug-in module system.

In one preferred embodiment, the present invention may comprise an injector/ejector defined by a unitary lever arm and two finger extensions oppositely situated and which is attached to a front panel of a circuit board proximate to an exterior corner of the circuit board. The lever is attached with a shoulder screw assembly comprised of a screw, bearing, and friction spring to a corner shaped mounting block positioned on the opposite side of the circuit board.

The lever is manufactured of stainless steel and thus will not promote the galling of the extruded VXI inject/eject bearing surface which is aluminum. Due to the configuration of the inject/eject lever of the present invention, the mechanical advantage of the lever is approximately 4.0 for insertion and 3.0 for ejection. Stated differently, the present invention requires ¼ the necessary force for insertion and ⅓ the necessary force for ejection to be supplied by the operator. This is a substantial improvement over the prior art.

The lever handle extends outwardly through a notch in one edge of the front panel that is orthogonally secured to the printed circuit board by means of a corner mounting block such that the front panel is secured adjacent and perpendicular to the exterior vertical edge of the circuit board. The upper end of the lever arm is formed in such a manner that when the module is in the installed position, the grasping surface of the lever is approximately 3.5–4.0 mm away from the surface of the front panel, thus allowing actuation of the lever for the ejection process by the operator's fingertip, rather than the operator's fingernail.

The finger that actuates the ejection process operates through an aperture in the front panel that is situated proximate to the notched edge and the outside corner of the front panel. The ejection finger is also formed in such a manner that approximately 17 degrees of rotation is permitted before the ejection bearing surface of the mainframe is engaged, thus permitting the operator to obtain leverage under the lever before the ejection process begins. The extension finger that actuates the injection process remains on the interior side of the front panel, its exposure to the outside being unnecessary for effective operation.

These and other features and advantages of the present invention will be better understood with reference to the following description and appended claims taken in conjunction with the accompanying drawings.

DETAILED DESCRIPTION OF THE PREFERRED EMBODIMENT

Figure 3:
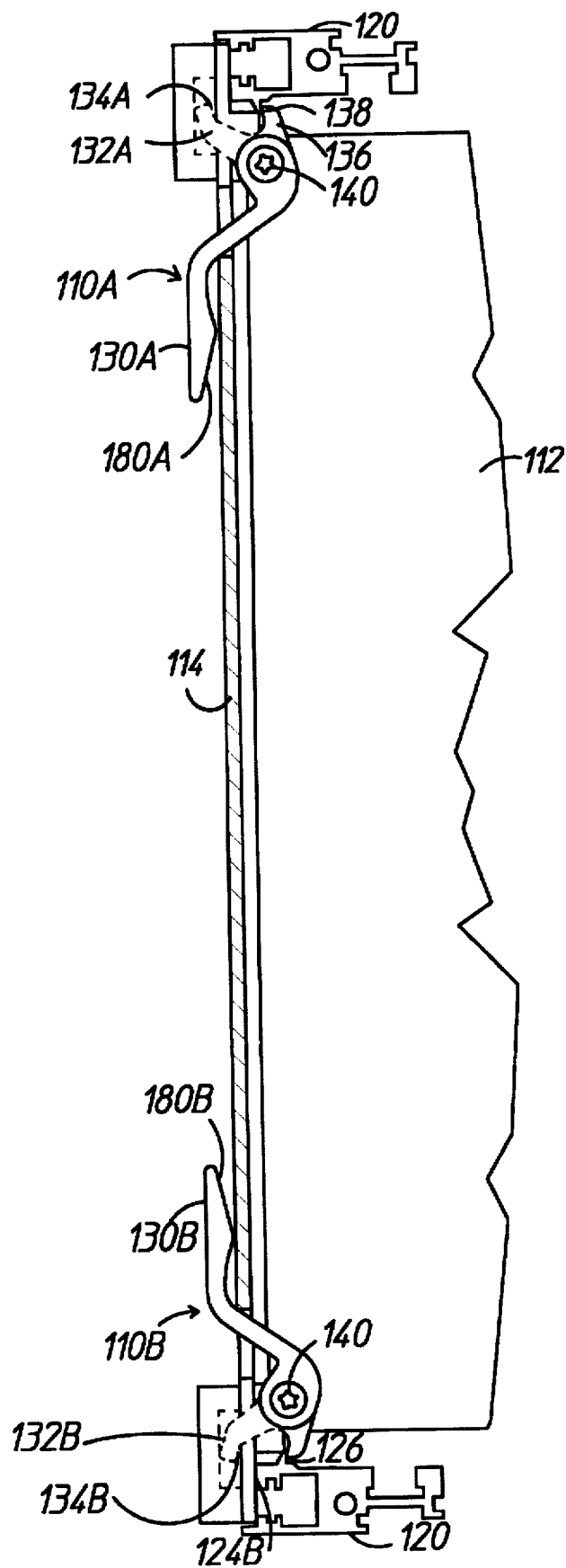
FIG. 3 shows a side cut-away view of a printed circuit board plug-in module fully inserted into a mainframe according to the present invention.
Figure 4:
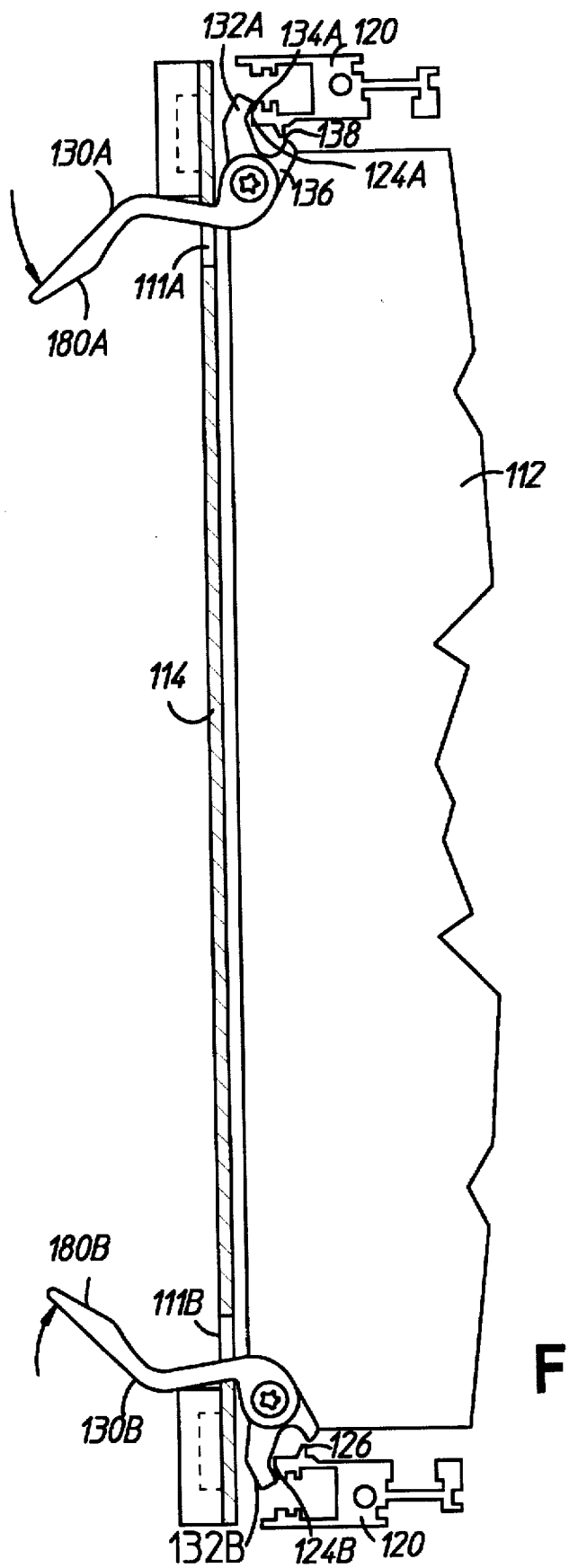
FIG. 4 shows a side cut-away view of a printed circuit board plug-in module inserted, but disengaged from a mainframe according to the present invention.
Figure 5:
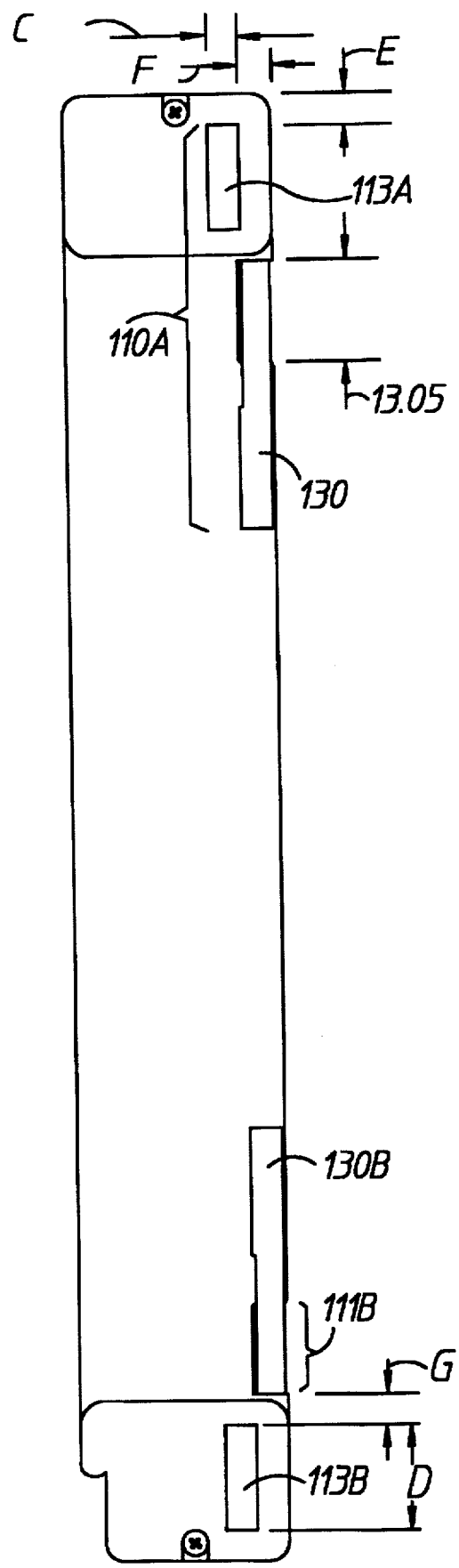
FIG. 5 shows a front panel of a printed circuit board plug-in module according to the present invention.

Referring now to the drawings, the improved inject/eject system for rack mounted printed circuit plug-in modules will be examined in further detail. The reference characters without letters represent the the invention generally, whereas the reference characters with letters represent a specific embodiment of the invention. FIGS. 3–5 illustrate a pair of inject/eject levers 110A and 110B as components of a system including a printed circuit pug-in module 112 having a front panel 114 secured to one end of the plug-in module 112 in an orthogonal relationship therewith. Two notches 111A and 111B and slots 113A and 113B are provided on opposite ends along one side of front panel 114 to permit the pivotal movement of inject/eject levers 110A and 110B.

Figure 1:
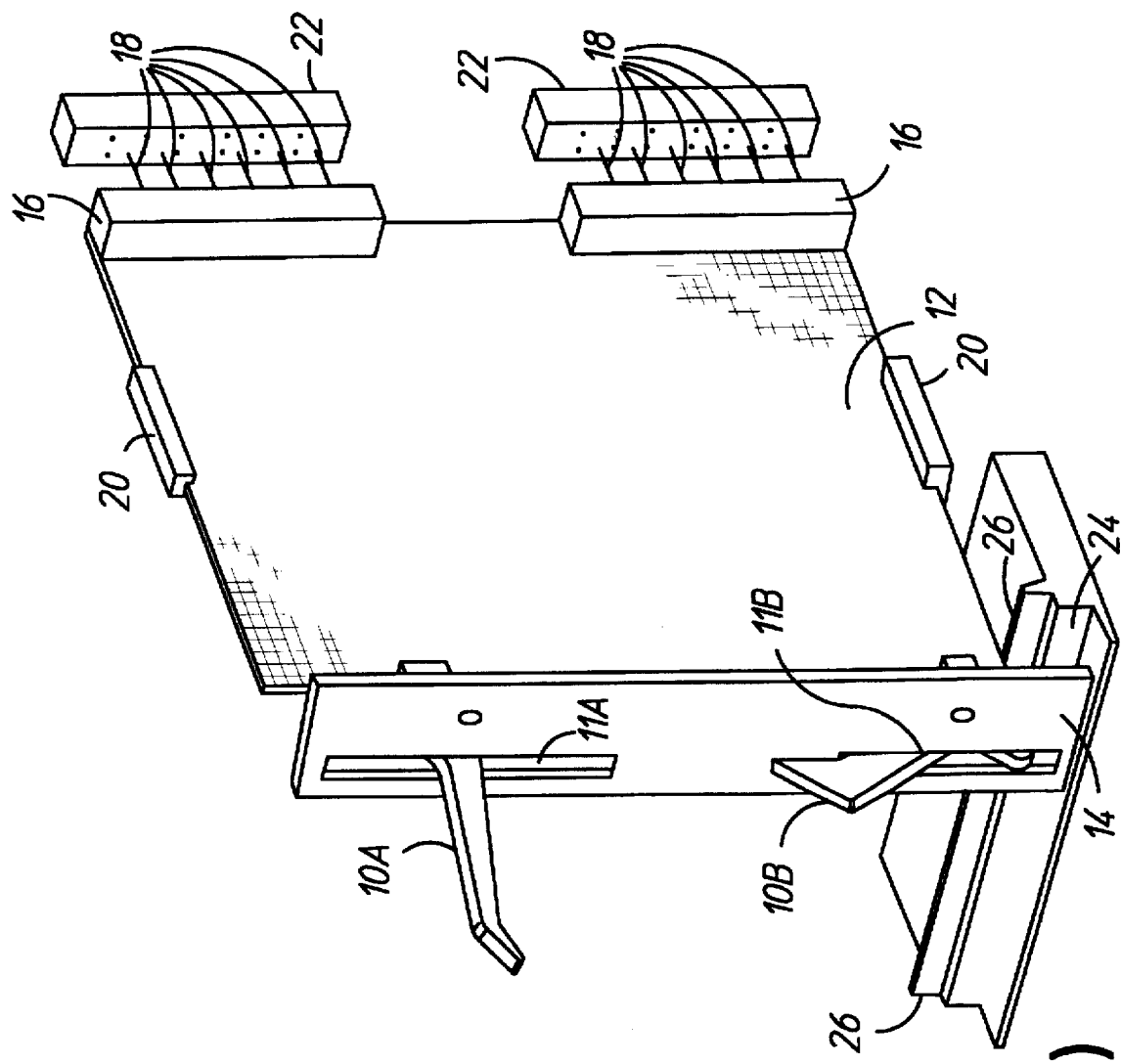
FIG. 1 shows a perspective illustration of a prior art printed circuit board plug-in module showing the printed circuit board disengaged from the electrical connector of the mainframe.
Figure 2:
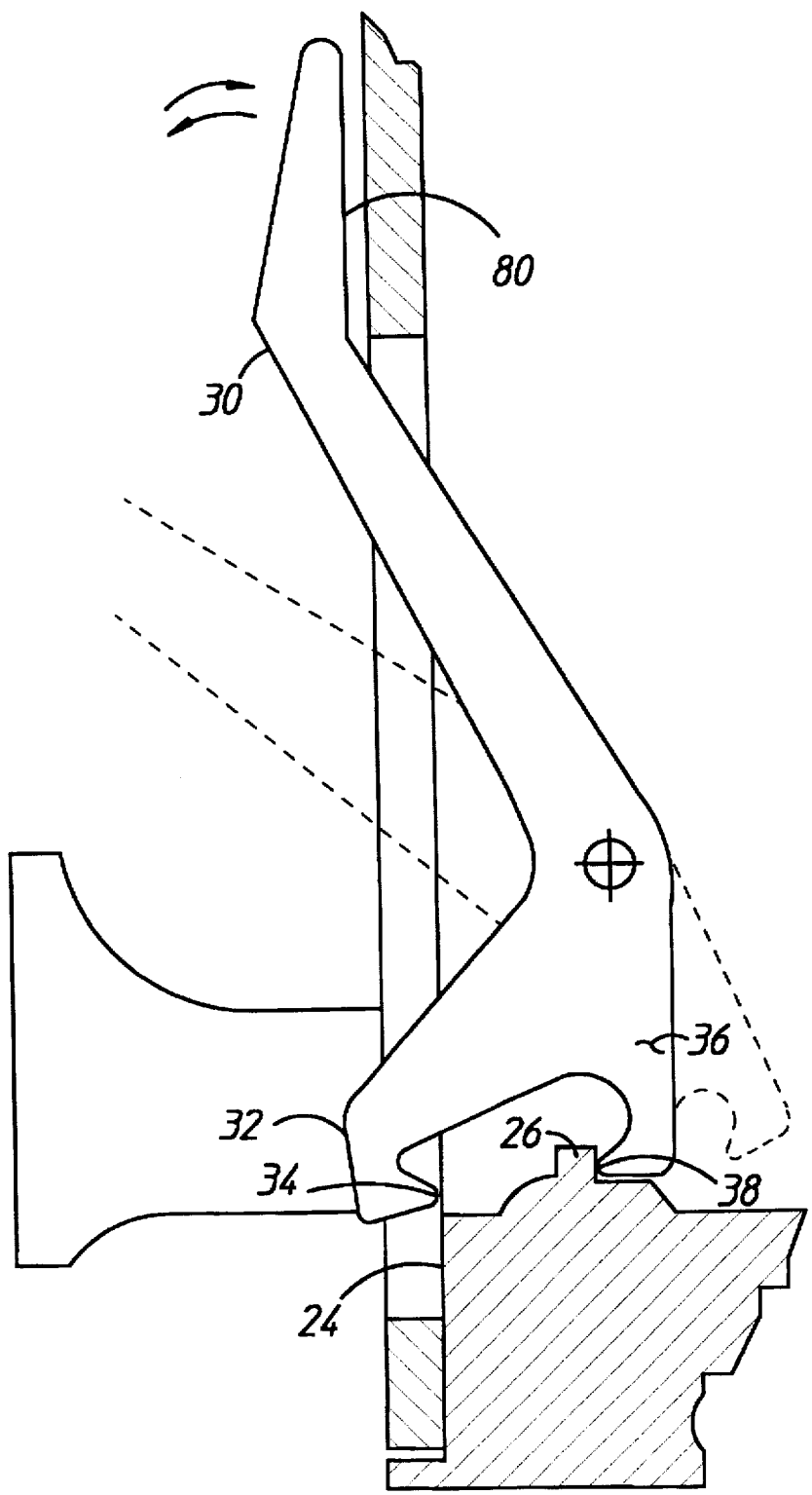
FIG. 2 shows an enlarged view of a prior an type of plug-in module injector/ejector lever as illustrated in FIG. 1.

The relationship of module 112 to the corresponding mainframe (partially illustrated by element 120) operates similar to module 12 in FIG. 1. Specifically, module 112 is slid along guides (not shown) until it is mated with electrical connectors (not shown) at the back of the mainframe 120. The configuration of mainframe 120 includes a common bearing surface 124 for extracting the electrical connectors (not shown) of module 112 from the electrical connectors (not shown) of mainframe 120 and a common injection bearing surface 126 for inserting the electrical connectors (not shown) of module 112 into the electrical connectors (not shown) of mainframe 120.

For the insertion operation, module 112 is slid along the mainframe guides (not shown) until it reaches the position slightly beyond that shown in FIG. 4. As the injection surface 138 of finger 136 comes into contact with mainframe injection bearing surface 126, the operator applies a pivotally downward force on lever arm 130A toward the front panel 114 and simultaneously applies a pivotally upward force on lever arm 130B toward the front panel 114 until the electrical connectors (not shown) of the module 112 are engaged with the electrical connectors (not shown) of the mainframe 120 and the inject/eject levers 110A and 110B reach the configuration as shown in FIG. 3.

For the ejection operation, the operator inserts his/her fingers under the grasping surface 180A of lever arm 130A and the grasping surface 180B of lever arm 130B (the levers 110A and 110B are in the configuration as shown in FIG. 3). The lever of the present invention has an angled surface at the end of the lever arm 130 (FIGS. 7–11) in order to enable the operator to slide his/her fingertip under the lever without having to pry the lever up with his/her fingernail or some other substantially flat object, such as a screw driver blade, which can damage the front panel. The operator then simultaneously applies a pivotally upward force to surface 180A of lever arm 130A and a pivotally downward force to surface 180B of lever arm 130B, which causes ejector finger surfaces 134A and 134B to contact ejection bearing surfaces 124A and 124B of mainframe 120, respectively. The operator continues to apply force until the electrical connectors (not shown) of module 112 are disengaged from the electrical connectors (not shown) of mainframe 120. Module 112 is slid along the guides (not shown) of mainframe 120 and removed therefrom.

In a preferred embodiment, the ejection finger surfaces 134A and 134B are a slight distance from the ejection bearing surfaces 124A and 124B, respectively, in order to permit approximately 17° of pivotal movement before the ejection bearing surfaces 124A and 124B are engaged, which allows the operator to get his/her fingers under the levers better and to obtain leverage prior to applying the ejection force.

FIG. 5 shows a front view of front panel 114 which illustrates notches 111A and 111B that are in one side of front panel 114 and extend approximately 4 mm toward the center of front panel 114. Slot 113A is laterally adjacent and vertically above notch 111A effectuated to receive eject finger 132A of lever 110A. Slot 113B is similarly placed laterally adjacent and vertically below notch 111B effectuated to receive eject finger 132B of lever 110B. Slots 113A and 113B are approximately 4.45 mm wide (represented by letter C in FIG. 5) by 15.07 mm in length (represented by the letter D in FIG. 5) and are approximately 4.24 mm from the top and bottom edges, (E in FIG. 5) respectively, of front panel 114, approximately 3.6 mm from the proximate side edge of front panel 114, (F in FIG. 5) and approximately 4.25 mm from the top and bottom edges of notches 111A and 111B, (G in FIG. 5) respectively. Accordingly, as inject/eject levers 110A and 110B are connected to module 112 on the back side of front panel 114, notches 111A and 111B and slots 113A and 113B permit levers 110A and 110B to pivot about the point of rotation 140. The position of notches 111 and slots 113 toward the farthest extreme corners of the front panel permit as much area as possible on the front panel to be used for electrical connections and graphical markings, which is becoming more and more important, especially as front terminal cards (shown in FIG. 6) are now capable of having more than 300 electrical connections, with the major present limitation being available space to accommodate the connections and wires.

Figure 6:
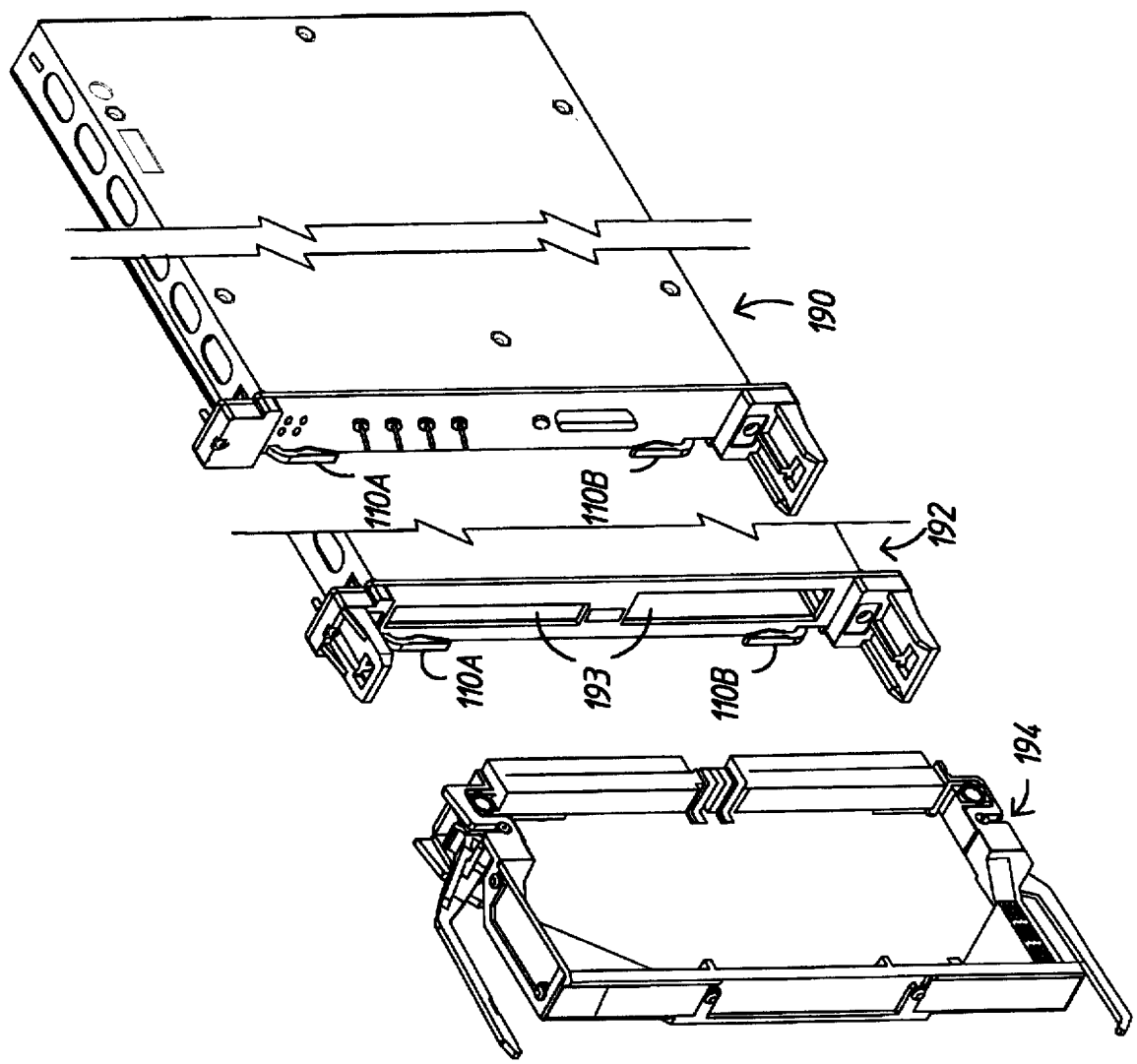
FIG. 6 shows a first and a second embodiment of the present invention, one for a typical printed circuit board plug-in module and the other for a printed circuit board plug-in module adapted to accommodate a mass termination card.

FIG. 6 illustrates a printed circuit module 190 that does not include front panel terminal card access and a printed circuit module 192 that includes front panel access 193 for electrical connection of a terminal card 194, which is more fully described and explained in related U.S. patent application Ser. No. 08/369,823, filed Jan. 6, 1995 to Robert Millard, entitled MASS TERMINATION OF SIGNALS FROM ELECTRICAL SYSTEMS TO DEVICES UNDER TEST, which is hereby incorporated for all that it teaches.

FIGS. 3–6 illustrate an embodiment having two inject/eject levers 110A and 110B at opposing ends of front panel 114. However, it will be readily appreciated that the present invention contemplates an embodiment comprising only one inject/eject lever, albeit an inferior embodiment in terms of mechanical advantage and stresses on module 112. It is to be further appreciated that the two inject/eject levers 110A and 110B are mirror images of each other in configuration and operation. Thus, a detailed description of inject/eject lever 110B will be sufficient to appreciate both inject/eject levers.

Figure 7:
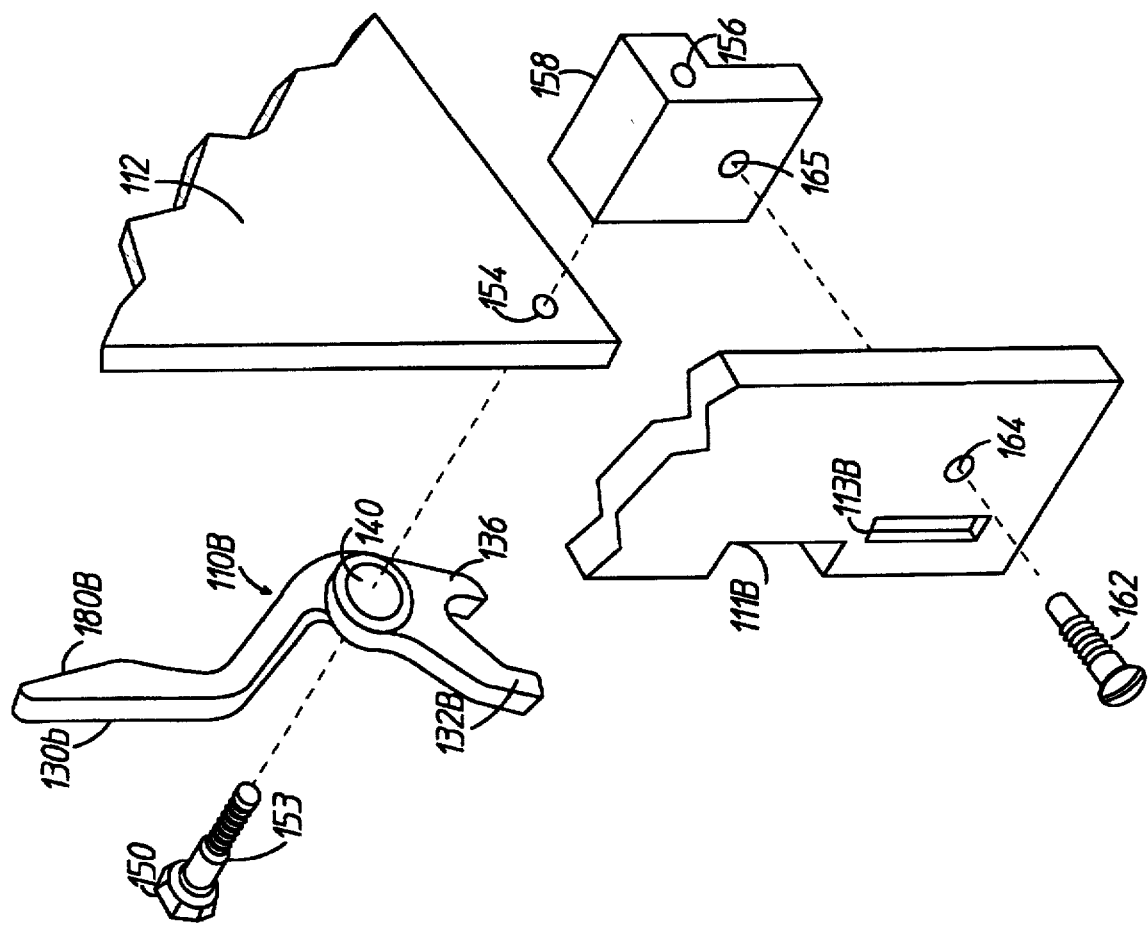
FIG. 7 shows an exploded perspective view of the present invention, illustrating the means by which components of the system are secured in assembled configuration.

The interrelationship between the components of the inject/eject system that are mounted on the plug-in module 112 is illustrated in FIG. 7. Specifically, a preassembled screw 150 with bearing and friction spring 153 is inserted into the pivot aperture 140 of inject/eject lever 110B, inserted through module aperture 154 and is screwed into threaded aperture 156 in support block 158. A screw 162 is inserted through aperture 164 in front panel 114 and screwed or otherwise secured in aperture 165 of support block 158. When inject/eject lever is secured to module 112 and front panel 114, lever arm 130 will extend through notch 111B and eject finger 132 will extend through slot 113B. The rest of the inject/eject lever 110B will be on the opposite side of front panel 114. This configuration will permit inject/eject lever 110B to pivot about the pivot aperture 140 whilst using the fewest number of components and taking up the least amount of useable area on the front panel and on the printed circuit module 112.

Turning now to FIGS. 8–13, the inject/eject lever 110B will be explained in more detail. In particular, lever 110B comprises a lever arm 130 that has a width (H in FIG. 12) of approximately 3.2±0.25 mm and a thickness of approximately 2.0±0.25 mm at its tip. An upper side surface 183 of lever arm 130 remains relatively flat, while the lower side grasping surface 180 angles away from surface 183 (I in FIG. 10) at approximately 14°±0.5° starting from a first end 202 and reaching a final thickness (J in FIG. 11) of approximately 4.77±0.25 mm at a middle portion 204 before angling back down to approximately 3.2±0.25 mm at a second end 206 (K in FIG. 11), thus creating a grasping member of lever arm 130. At this point, the entire lever arm 130 begins to angle towards the pivotal aperture 140 at an angle of approximately 55° (L in FIG. 11). In a preferred embodiment, a ledge 181 traverses the perimeter of the lever arm 130 on a first side of the end of said lever arm 130 (see FIGS. 9 and 11–13). The ledge 181 is approximately 0.4±0.25 mm in height (M in FIG. 13) and 1.0±0.25 mm thick (N in FIG. 11). Due to manufacturing considerations, this ledge allows for radiused corners, as opposed to sharp corners, on the grasping portion of lever arm 130, as well as providing a grasping surface during operation, and may alternatively be on both sides of the lever arm i.e., ledge 181 may also traverse a second side 184 of the lever arm 130.

Figure 8:
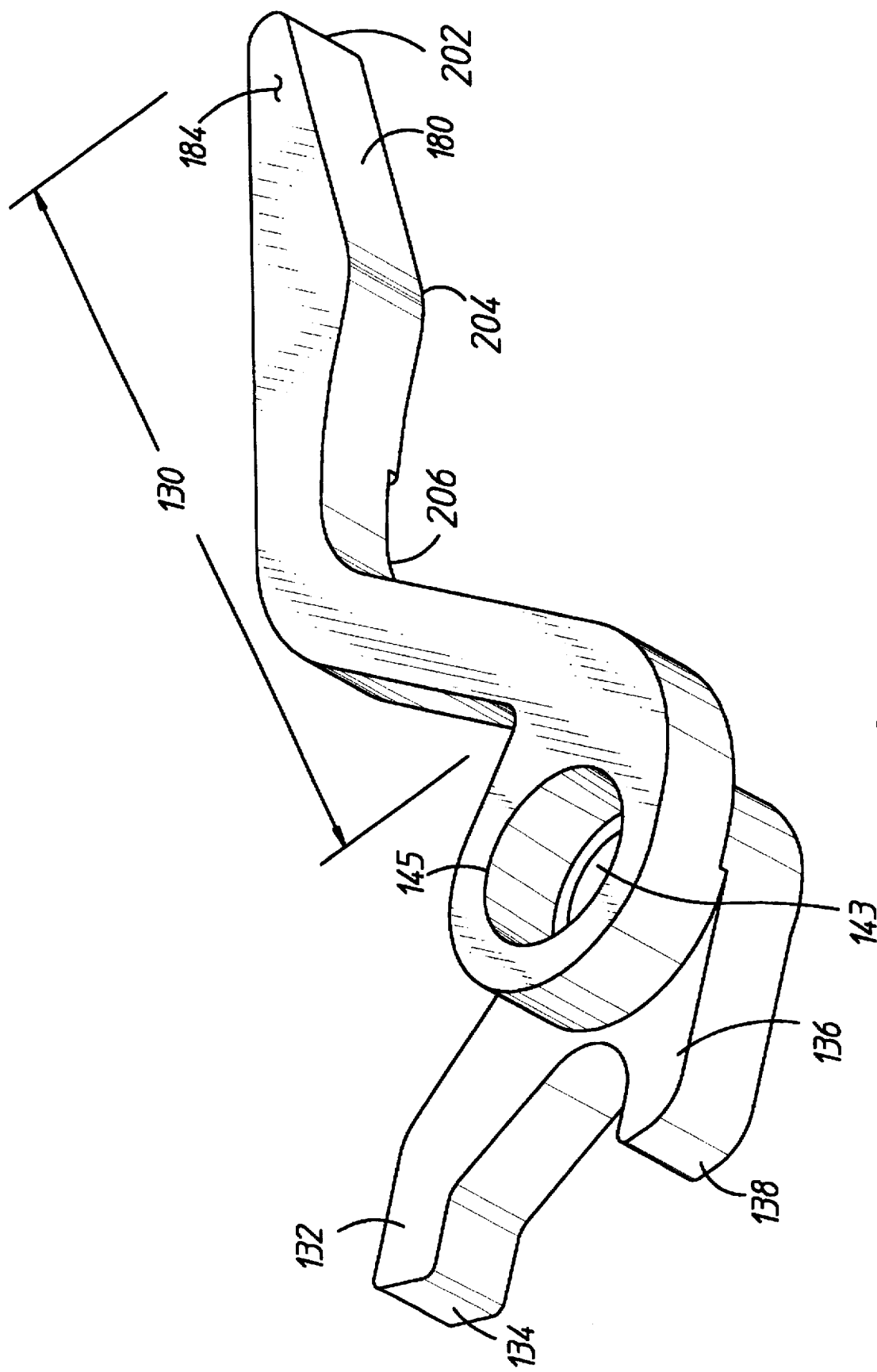
FIG. 8 shows a first side perspective view of an injection/ejection lever according to the present invention.
Figure 10:
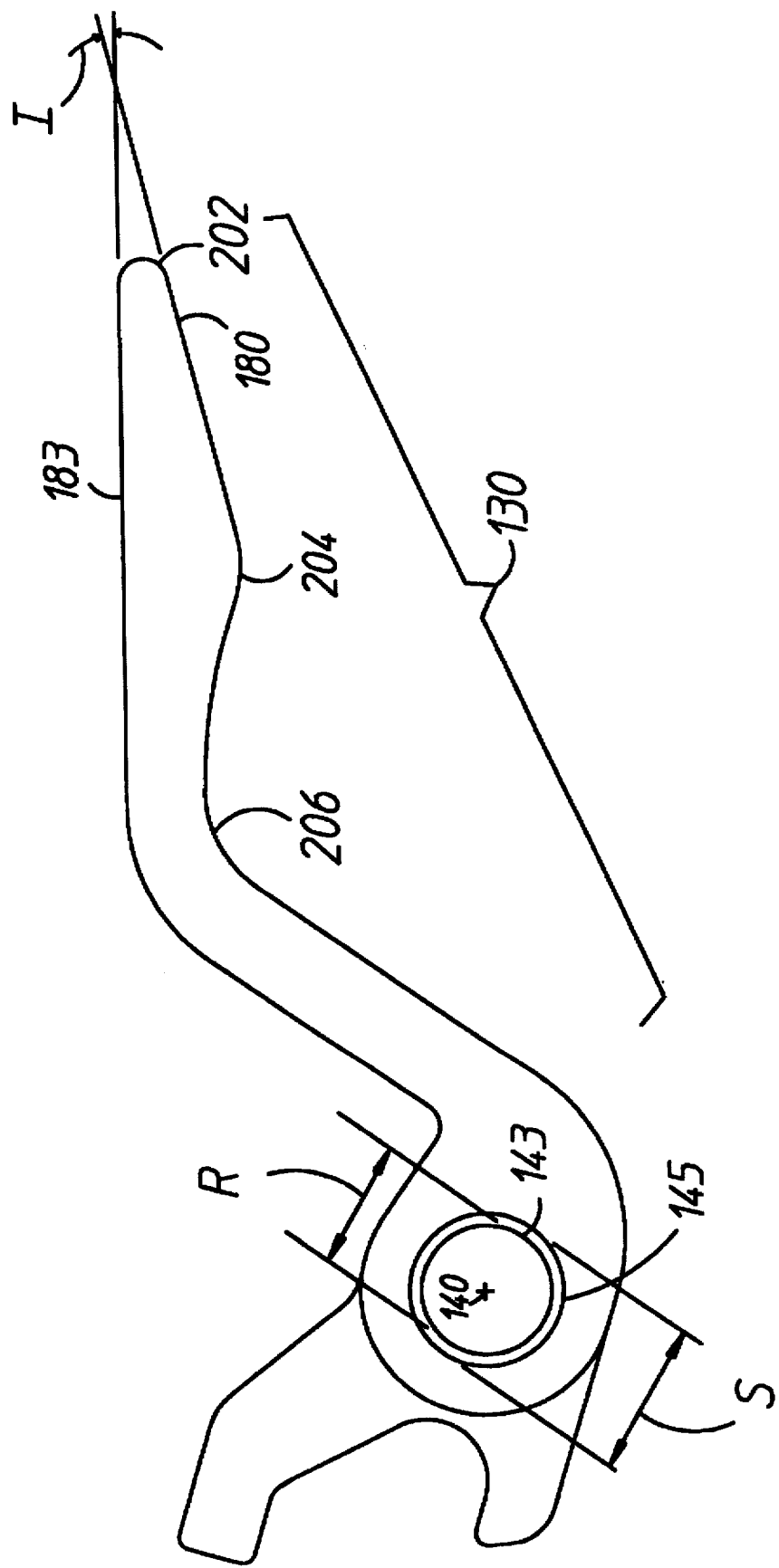
FIG. 10 shows a first side view of an injection/ejection lever according to the present invention.

As the lever arm 130 reaches the pivotal axis portion of the lever 110B, it becomes a circular boss 141 having an outside diameter (O in FIG. 11) of approximately 10.32±0.25 mm and being raised on the first side (Q in FIG. 12) by approximately 3.51±0.25 mm. A first hole 143 is bored completely through the lever with the center of pivot aperture 140 having a diameter of approximately 5.3±0.038 mm (R in FIG. 10). A second hole 145 is bored from the second side of said lever to a depth of 3.31±0.076 mm with the same center as the first hole, having a diameter (S in FIG. 10) of approximately 6.85±0.038 mm. This creates pivot aperture 140 that houses the bearing 150 and a bore area 145 that houses the screw head 153 and spring assembly when assembled (FIGS. 8 and 10).

Figure 11:
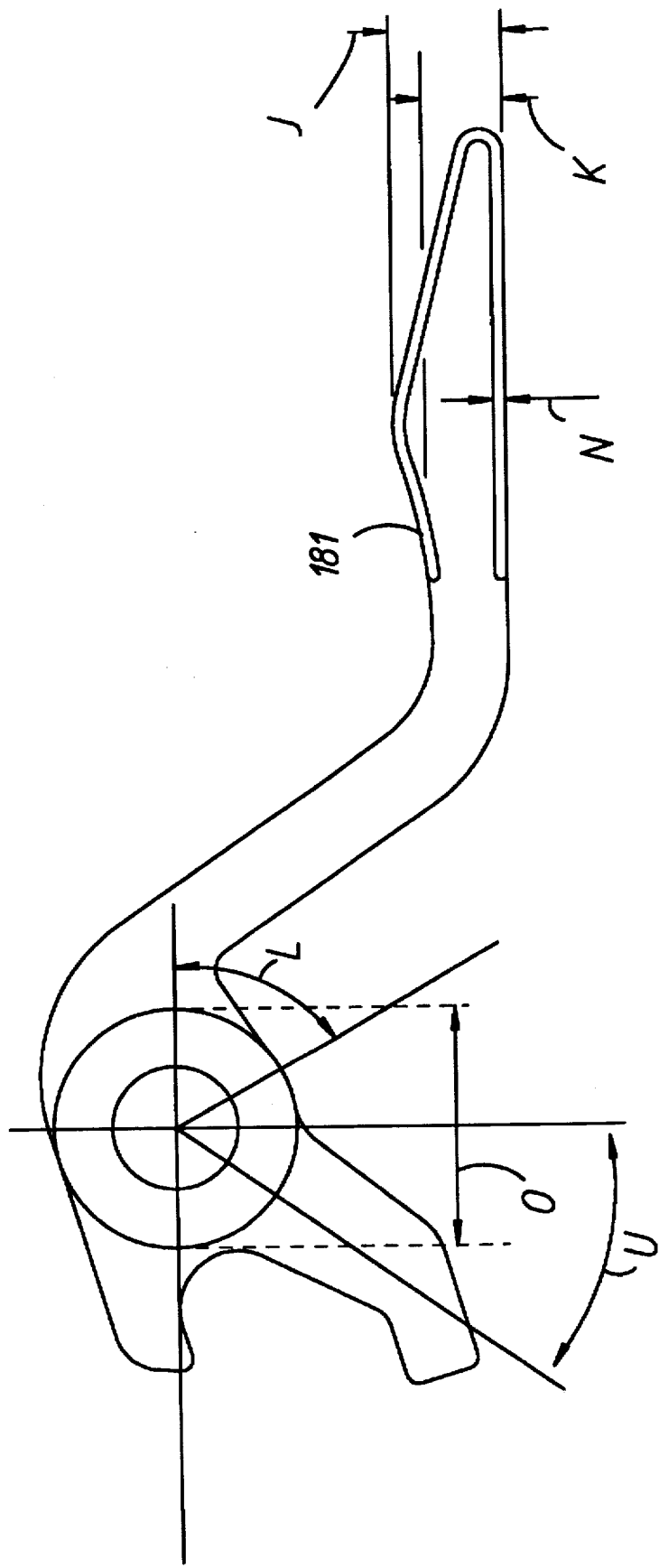
FIG. 11 shows a second side view of an injection/ejection lever according to the present invention.
Figure 12:
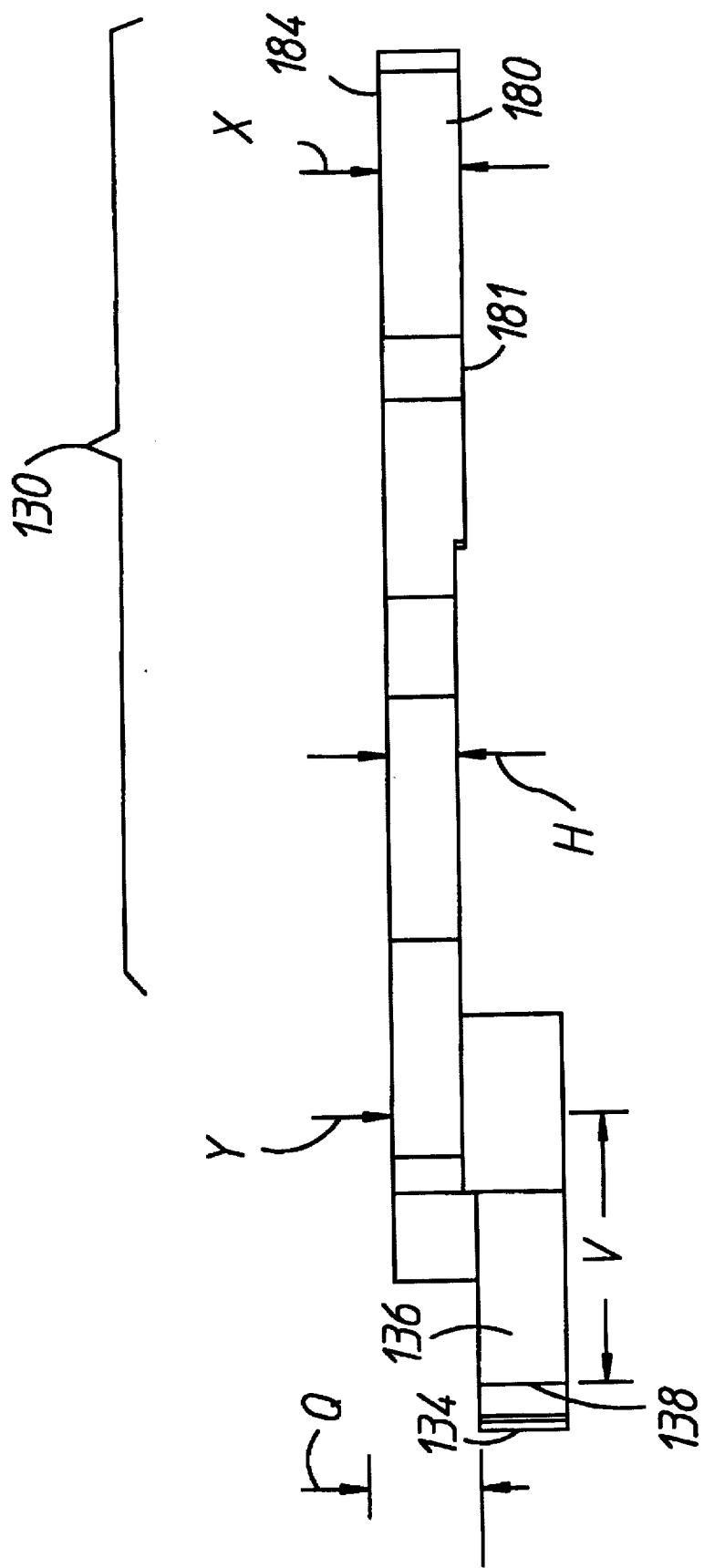
FIG. 12 shows a rear view of an injection/ejection lever according to the present invention.

Two fingers (132 and 136) extend from the circular boss 141 on the second side of the lever 110B (FIGS. 9 and 11–13), creating a C-shaped bracket. Ejection finger 132 extends approximately 13.6±0.25 mm from the center of pivot aperture 140 (T in FIG. 13) at approximately a 55° angle (U in FIG. 11) from the lever arm 130 attached to the opposite side of the boss 141 (FIGS. 10 and 11). Injection finger 136 extends approximately 10.5±0.25 mm from the center of pivot aperture 140 (V in FIG. 12) at approximately a 164° angle from the lever arm 130 attached to the opposite side of the boss 141 (FIGS. 10 and 11). Both the injection finger 136 and the ejection finger 132 are hooked at their ends to form a C-shaped configuration in order to effectuate the engagement of injection bearing surface 126 and the ejection bearing surface 124 of mainframe 120, respectfully. Dimension X in FIG. 12 is the width of the lever arm 130 at the grasping end, which is 3.6±0.25 mm. Dimension Y in FIG. 12 is the width of the lever across the boss 141 area, which is 6.97±0.25 mm. Dimension Z is the length of the entire inject/eject lever, which is 53.73±0.25 mm.

Figure 9:
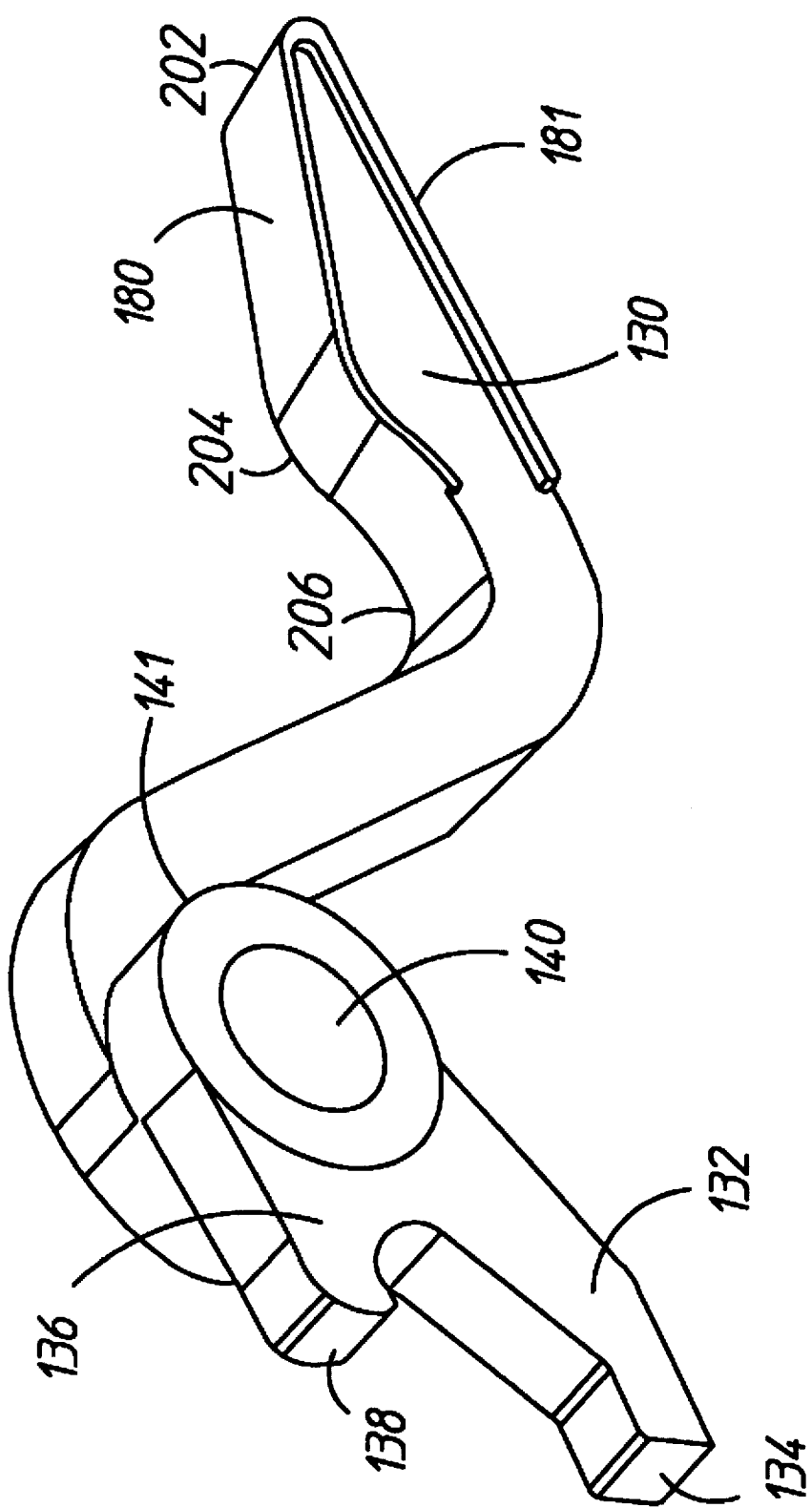
FIG. 9 shows a second side perspective view of an injection/ejection lever according to the present invention.
Figure 13:
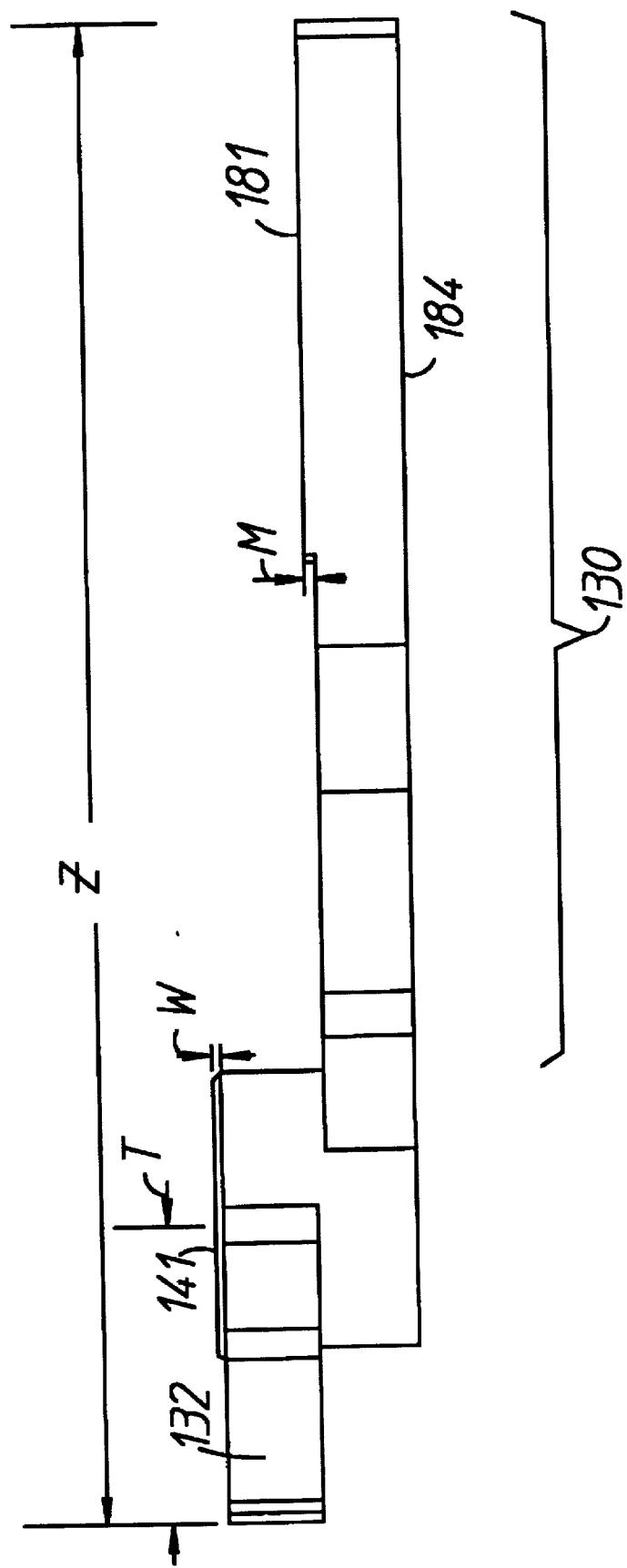
FIG. 13 shows a front view of an injection/ejection lever according to the present invention.

In a preferred embodiment, boss 141 will extend approximately an additional 0.08 mm beyond the thickness of the two fingers 132 and 136 (see FIGS. 9 and 13). This raised boss area 141 helps alleviate friction between the lever and the printed circuit module 112 when the operator applies a pivotal force to the lever during injection or ejection of the module 112 (see FIG. 7).

Lever 110 is preferably manufactured by a stainless steel metal-injection-molded process. As the VXIbus Consortium open standard calls for extruded aluminum injection/ejection bearing surfaces, the stainless steel will minimize galling of the injection and ejection bearing surfaces, both on the lever 110 and on the mainframe 120. However, any hard material could be used, including metals such as aluminum, and any known manufacturing process could be utilized such as machining or metal extrusion. It is preferable that the lever be made of a material different from that of the injection and ejection bearing surfaces of the mainframe, in order to minimize the possibility of galling on either surface.

It is not intended to be exhaustive or to limit the invention to the precise form disclosed, and other modifications and variations may be possible in light of the above teachings. For example, the angles and dimensions of the preferred embodiment of the lever could be varied without departing from the overall concepts of the invention. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A device for injecting and ejecting a printed circuit board module into and out of a mainframe having an injection bearing surface and an ejection bearing surface, said bearing surfaces being manufactured from a material, said injecting/ejecting device comprising:

a grasping member having a first end, a middle portion and a second end, said grasping member having an upper side and a lower side, said grasping member having a first side and a second side, said lower side of said grasping member being wide at said middle portion and narrowing toward said first end;

a lever arm for operating said injecting/ejecting device, said lever arm having a first end and a second end, said first end being integral with said second end of said grasping member and extending therefrom;

a pivot member having a first section and a second section, said first section of said pivot member being integrally connected to said second end of said lever arm, said second section of said pivot member being integral with and adjacent to said first section of said pivot member, said pivot member having a bore hole permitting an interconnection of said injecting/ejecting device to said printed circuit board module, and permitting pivotal movement of said injecting/ejecting device about said interconnection to said printed circuit module;

an injection finger extending from a lower portion of said second section of said pivot member and integrally connected thereto, said injection finger defining an injection surface on a lower end thereof for contacting said injection bearing surface of said mainframe during insertion of said printed circuit module into said mainframe;

an ejection finger extending from an upper portion of said second section of said pivot member and integrally connected thereto, said ejection finger defining an ejection surface on a lower end thereof for contacting said ejection bearing surface of said mainframe during extraction of said printed circuit module from said mainframe;

a front panel adapted to be fixedly attached to a front end of said printed circuit module and perpendicular thereto, said front panel having a notch along an edge thereof and a slot in close proximity to said notch;

a mounting block adapted to be fixedly attached to said printed circuit module and to said front panel; and a connection member extending through said bore hole of said pivot member of said injecting/ejecting device and adapted to be attached to said printed circuit module, said connection member permitting pivotal movement of said injecting/ejecting device, said injecting/ejecting device adapted to be attached to said printed circuit module in such a manner that said pivot member of said injecting/ejecting device is on a back side of said front panel, said lever arm and said grasping member extend through said notch in said front panel toward a front side of said front panel, said ejection finger extends through said slot in said front panel toward said front side of said front panel when said printed circuit module is in its fully inserted position within said mainframe, said ejection finger being rotated toward said back side of said front panel and coming into contact with said ejection bearing surface during ejection.

2. The injecting/ejecting device according to claim 1, wherein said first end of said grasping member of said injecting/ejecting device is shaped in such a manner such that when said injecting/ejecting device is in a locked position, said first end of said grasping member is curved away from said front side of said front panel such that an operator is able to insert a tip of his/her finger between said grasping member and said front panel.

3. The injecting/ejecting device according to claim 2, wherein said injecting/ejecting device is manufactured of a material that is not the same as a material from which said injection and ejection bearing surfaces of said mainframe is manufactured.

4. The injecting/ejecting device according to claim 2, wherein said injecting/ejecting device is manufactured of stainless steel.

* * * * *